(12) United States Patent
Keupp et al.

(10) Patent No.: US 10,935,617 B2
(45) Date of Patent: Mar. 2, 2021

(54) IMAGE QUALITY CONTROL IN DYNAMIC CONTRAST ENHANCED MAGNETIC RESONANCE IMAGING

(71) Applicant: KONINKLIJKE PHILIPS N.V., Eindhoven (NL)

(72) Inventors: Jochen Keupp, Rosengarten (DE); Jan Jakob Meineke, Hamburg (DE); Karsten Sommer, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/463,922

(22) PCT Filed: Nov. 23, 2017

(86) PCT No.: PCT/EP2017/080135
§ 371 (c)(1),
(2) Date: May 24, 2019

(87) PCT Pub. No.: WO2018/096006
PCT Pub. Date: May 31, 2018

(65) Prior Publication Data
US 2019/0285711 A1    Sep. 19, 2019

(30) Foreign Application Priority Data

Nov. 28, 2016 (EP) .................................... 16200952

(51) Int. Cl.
*G01V 3/00* (2006.01)
*G01R 33/54* (2006.01)
(Continued)

(52) U.S. Cl.
CPC .......... *G01R 33/543* (2013.01); *G01R 33/50* (2013.01); *G01R 33/5601* (2013.01); *G01R 33/583* (2013.01)

(58) Field of Classification Search
CPC .............. G01R 33/543; G01R 33/5659; G01R 33/3415; G01R 33/36; A61B 5/055
(Continued)

(56) References Cited

U.S. PATENT DOCUMENTS

| 5,600,574 A | * | 2/1997 | Reitan | ............. | H04N 1/00002 |
| | | | | | 702/185 |
| 7,528,365 B2 | * | 5/2009 | Guo | ................ | G01N 33/6848 |
| | | | | | 250/282 |

(Continued)

OTHER PUBLICATIONS

D.-M. Yeo et al."Correlation of dynamic contrast-enhanced MRI perfusion parameters with angiogenesis and biologic aggressiveness of rectal cancer: Preliminary results", JMRI 41:474-480, 2015.
(Continued)

*Primary Examiner* — Walter L Lindsay, Jr.
*Assistant Examiner* — Frederick Wenderoth

(57) ABSTRACT

The invention provides for a magnetic resonance imaging system (100) comprising a memory (134) for storing machine executable instructions (140) and pulse sequence commands (142). The pulse sequence commands are configured for controlling the magnetic resonance imaging system according to a DCE Magnetic Resonance Imaging protocol. The magnetic resonance imaging system further comprises a user interface (200) and a processor (130) for controlling the magnetic resonance imaging system. Execution of the machine executable instructions causes the processor to: control (500) the magnetic resonance imaging system using the pulse sequence commands to acquire calibration magnetic resonance data (144) two or more times for varying flip angles; reconstruct (502) each acquisition of the calibration magnetic resonance data into a calibration image (146) to create a set of variable flip angle images (148); calculate (504) a T1 mapping (150) using the set of variable flip angle images; calculate (506) a contrast agent
(Continued)

calibration (152) for a predetermined magnetic resonance imaging contrast agent using at least partially the T1 mapping; calculate (508) an estimated calibration error (154) that is descriptive of an estimated error in the contrast agent calibration and/or the T1 mapping using a calibration accuracy model, wherein the calibration accuracy model is configured for calculating the estimated calibration error using the set of variable flip angle images; and display (510) a calibration warning message (202) on the user interface if the estimated calibration error is outside of a predetermined calibration error range.

20 Claims, 6 Drawing Sheets

(51) Int. Cl.
G01R 33/50 (2006.01)
G01R 33/56 (2006.01)
G01R 33/58 (2006.01)

(58) Field of Classification Search
USPC .......................................... 399/324; 324/309
See application file for complete search history.

(56) References Cited

U.S. PATENT DOCUMENTS

| | | | |
|---|---|---|---|
| 2005/0267348 A1* | 12/2005 | Wollenweber | A61B 6/544 600/407 |
| 2006/0025667 A1 | 2/2006 | Ashton | |
| 2006/0293588 A1 | 12/2006 | Beck et al. | |
| 2008/0197841 A1 | 8/2008 | Fleysher et al. | |
| 2010/0183206 A1 | 7/2010 | Carlsen et al. | |
| 2011/0043204 A1 | 2/2011 | Bielmeier et al. | |
| 2012/0128132 A1* | 5/2012 | Coolens | A61B 6/583 378/207 |
| 2012/0215375 A1* | 8/2012 | Chang | B60W 50/08 701/1 |
| 2012/0277833 A1* | 11/2012 | Gerber | A61N 1/0526 607/62 |
| 2013/0154638 A1 | 6/2013 | Jena | |
| 2013/0200900 A1* | 8/2013 | Buurman | G01R 33/583 324/322 |
| 2014/0010432 A1 | 1/2014 | Cohen-Solal et al. | |
| 2014/0233817 A1 | 8/2014 | Hernando et al. | |
| 2015/0097562 A1 | 4/2015 | Grodzki et al. | |
| 2015/0157207 A1 | 6/2015 | Ikeda et al. | |
| 2015/0309141 A1* | 10/2015 | Kim | G01R 33/56366 600/416 |
| 2017/0039706 A1* | 2/2017 | Mikhno | G06T 15/08 |

OTHER PUBLICATIONS

T. Tong et al., "Dynamic contrast-enhanced MRI: Use in predicting pathological complete response to neoadjuvant chemoradiation in locally advanced rectal cancer" JMRI 42:673-680, 2015.

T.E. Yankeelov and J.C. Gore, "Dynamic Contrast Enhanced Magnetic Resonance Imaging in Oncology:Theory, Data Acquisition,Analysis, and Examples" Curr Med Imaging Rev 3:91-107, 2009.

DCE MRI Technical Committee. DCE MRI quantification profile, quantitative imaging biomarkers alliance. Version 1.0. QIBA, 2012.

J. Sijbers et al., "Automatic estimation of the noise variance from the histogram of a magnetic resonance image" Phys Med Biol 52:1335-1348, 2007.

P. Coupé et al., "Robust Rician noise estimation for MR images" Med Image Anal 14:483-493, 2010.

B. Martamet et al., "Automatic quality assessment in structural brain magnetic resonance imaging" Magn Res Med 62:365-372, 2009.

M.C. Schabel et al., "Uncertainty and bias in contrast concentration measurements using spoiled gradient echo pulse sequences" Phys Med Biol 53:2345-2373, 2008.

Sourbron et al "Classic Models for Dynamic Contrast Enhanced MRI" NMR Biomed. 26 p. 1004-1027 May 15, 2013.

International Search Report dated Mar. 22, 2018.

* cited by examiner

IMAGE QUALITY CONTROL IN DYNAMIC CONTRAST ENHANCED MAGNETIC RESONANCE IMAGING

CROSS REFERENCE TO RELATED APPLICATIONS

This application is a U.S. national phase application of International Application No. PCT/EP2017/080135 filed on Nov. 23, 2017, which claims the benefit of EP Application Serial No. 16200952.6 filed on Nov. 28, 2016 and is incorporated herein by reference.

FIELD OF THE INVENTION

The invention relates to magnetic resonance imaging, in particular to dynamic contrast enhanced magnetic resonance imaging.

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the B0 field or the main magnetic field. Various quantities or properties of the subject can be measured spatially using MRI.

One MRI imaging technique is T1 weighted imaging, a series of T1 weighted images acquired at different flip angles can be used to calculate a spatial mapping of the T1 relaxation time. There are injectable contrast agents which can modify the local T1 relaxation time within a subject. Before injection of the contrast agent, a mapping of the T1 relaxation time within a subject can be performed. This initial T1 relaxation time map can be used to calibrate the effects of a known contrast agent on a subject. A series of T1 weighted images can then be acquired after injection of the contrast agent at different time intervals. This series of T1 weighted images and the calibration created from the initial T1 relaxation time map can be used to make quantitative measurements of the contrast agent within the subject. These quantitative measurements can then be interpreted in terms of physiological tissue characteristics using tracer-kinetic modeling. One group of technique is Dynamic Contrast Enhanced (DCE) Magnetic Resonance Imaging. The journal article Sourbron, S. P. and Buckley, D. L. (2013), "Classic models for dynamic contrast-enhanced MRI," NMR Biomed., 26: 1004-1027. doi:10.1002/nbm.2940 reviews various DCE magnetic resonance imaging techniques and data analysis methods.

United States patent application US 2014/0010432 discloses a method that includes obtaining image data for a patient. The image data corresponds to acquisition data from an imaging acquisition from a set of planned image acquisitions in an examination plan for the patient. The method further includes analyzing the image data with a processor based on an imaging practice guideline and producing electronically formatted data indicative of the analysis. The processor generates a signal indicative of a recommendation of a change to the examination plan based on the data indicative of the analysis.

SUMMARY OF THE INVENTION

The invention provides for a magnetic resonance imaging system, a method, and a computer program product in the independent claims. Embodiments are given in the dependent claims.

A difficulty in DCE MRI is that before the imaging with the contrast agent is performed the patient specific protocol where various scan parameters are chosen and calibration are performed first. If a mistake is made in either the calibration or in the choice of the scan parameters the operator may not be aware of the error until the entire DCE MRI protocol has been completed. This may require the subject to return for a repeat examination much later or even on a different day.

Embodiments may provide for a means of ensuring the quality of DCE images by estimating a calibration error in the T1 mapping and/or the contrast agent calibration. A series of T1 weighted images may be acquired, at varying flip angles, to form a set of variable flip angle images. This set of variable flip angle images is used to construct the T1 mapping. Comparing the individual images of the set of variable flip angle images, can for example, be used to make an estimate of the noise in the T1 map. This noise estimate in the T1 map can be used as one criteria or "calibration error" that can be used to warn a user to take corrective action. The propagation of errors can be applied to a calibration equation for the contrast agent to calculate another variant of the "calibration error" in contrast agent calibration its self. This may have the advantage of being able to warn an operator that a calibration should be repeated or particular scan parameters should be changed.

In other embodiments, additional refinements may be added. For example a knowledge of the scan parameters to be used for the DCE MRI protocol and the calibration error may be used to calculate a predicted DCE image quality. For example the scan parameters and the calibration error could be used with a steady-state signal equation for gradient echo based magnetic resonance imaging to forward model the predicted DCE image quality. An advantage of this is that this DCE image quality is estimated before the contrast agent has been injected. If DCE image quality is not sufficient, corrective action can still be taken.

In other embodiments, even more refinements may be added. Another difficulty is that the results of a DCE MRI study can be dependent upon the scan parameters that are selected. This is often difficult to do correctly, because as one scan parameter is changed it may affect other values. Values of the current scan parameters can be compared to a central database or even a patient specific database to ensure that the DCE images are consistent. If the values are outside of a predetermined operating range, the operator can be warned and/or provided with corrections to make the scan parameters.

As a concrete example, two examples of scan parameters are the field-of-view (FOV) and the pulse repetition time (TR). A common case for an operator to select improper scan parameters would be that for a large patient that requires an increased field-of-view (FOV) or region of interest. The operator may increase the FOV which may lead the user to increase the acquisition matrix in order to maintain spatial resolution. This, however, leads to an increased TR and poorer temporal resolution, potentially violating the prescribed ranges. A similar problem can arise if the user selects more imaging slices than usual to cover a larger anatomical region—this also leads to poorer temporal resolution.

In one aspect the invention provides for a magnetic resonance imaging system. The magnetic resonance imaging system comprises a memory for storing machine-executable instructions and pulse sequence commands. Pulse sequence commands as used herein encompass commands or data which may be transformed into commands for causing a magnetic resonance imaging system to acquire magnetic resonance data of some sort. The pulse sequence commands may actually contain instructions for more than one type of magnetic resonance imaging data acquisition to fulfill data used for a particular imaging protocol.

The pulse sequence commands are configured for controlling the magnetic resonance imaging system according to a DCE or dynamic contrast enhanced magnetic resonance imaging protocol. In DCE magnetic resonance imaging the response of the magnetic resonance imaging system to the contrast agent is calibrated such that absolute measures of such quantities as the extra vascular extra cellular space or other tissue parameters such as the transfer constant can be measured. These may for example be useful for detecting the metabolism of tumorous tissue.

The magnetic resonance imaging system further comprises a user interface. The magnetic resonance imaging system further comprises a processor for controlling the magnetic resonance imaging system.

Execution of the machine-executable instructions causes the processor to control the magnetic resonance imaging system using the pulse sequence commands to acquire calibration magnetic resonance data two or more times for varying flip angles. The term 'calibration magnetic resonance data' is a label to indicate specific magnetic resonance data that is used for making a T1 mapping that can be used for quantitatively calibrating a contrast agent. Execution of the machine-executable instructions further causes the processor to reconstruct each acquisition of the calibration magnetic resonance data into a calibration image to create a set of variable flip angle images. The calibration magnetic resonance data is acquired multiple times for varying flip angles. This calibration magnetic resonance data is then reconstructed into a set of magnetic resonance images that is herein referred to as a set of variable flip angle images.

Execution of the machine-executable instructions further cause the processor to calculate a T1 mapping using the set of variable flip angle images. Execution of the machine-executable instructions further cause the processor to calculate a contrast agent calibration for a predetermined magnetic resonance imaging contrast agent using at least partially the T1 mapping. The T1 mapping can be used for calculating the contrast agent calibration because the set of variable flip angle images provide a baseline measurement for various flip angles. Execution of the machine-executable instructions further cause the processor to calculate an estimated calibration error that is descriptive of an estimated error in the contrast agent calibration and/or the T1 mapping using a calibration accuracy model.

The calibration accuracy model is configured for calculating the estimated calibration error using a set of variable flip angle images. The calibration accuracy model is a model which uses the individual images in the variable flip angle images to estimate the error in either the contrast agent calibration or in the T1 mapping. For example the various images may be compared to one another or other statistical measures may be applied to the various images to estimate the signal-to-noise ratio in the measurements. This can be used to provide an accurate estimate of the signal-to-noise or other error in the contrast agent and/or the T1 mapping.

Execution of the machine-executable instructions further cause the processor to display a calibration warning message on the user interface if the estimated calibration error is outside of a predetermined calibration error range. This may be beneficial because the acquisition of a DCE magnetic resonance image may involve a great deal of time where first the calibration magnetic resonance data is acquired and used to make a calibration. After the calibration is performed for example imaging can be performed with the predetermined magnetic resonance imaging contrast agent in the subject. It may be beneficial to have an estimate of the error in the calibration before time is wasted on acquiring images with the contrast agent in the subject matter.

In another embodiment, execution of the machine-executable instructions further cause the processor to receive a set of scan parameters for controlling the magnetic resonance imaging during execution of the pulse sequence commands. For example the scan parameters may indicate particular details of an examination of a subject. This for example may indicate the location or region of interest from which data is acquired, or there may be other parameters which are set by the user before magnetic resonance data of some sort is acquired. Execution of the machine-executable instructions further causes the processor to calculate a predicted DCE image quality using the set of scan parameters, the estimated calibration error, and using a steady-state signal equation for a gradient echo-based magnetic resonance imaging. Execution of the machine-executable instructions further cause the processor to display an acquisition warning message on the user interface if the predicted DCE image quality is outside of a predetermined image quality range.

In this embodiment, it may be beneficial because the predicted DCE image quality can be predicted even before DCE magnetic resonance images are acquired. This is done by using the set of scan parameters which is particular for a particular examination and the estimated calibration error and through modeling using the steady-state signal equation. This may be useful in predicting the DC image quality such as the predicated signal-to-noise and/or the predicted accuracy of particular contrast agent measurements or measurements which are derived from the contrast agent measurements. This may provide an effective means of preventing re-examination if the noise level or image quality is poor in DC images.

In another embodiment, execution of the machine-executable instructions further cause the processor to control the magnetic resonance imaging system with the pulse sequence commands to acquire a sequence of DCE magnetic resonance data. Execution of the machine-executable instructions further cause the processor to reconstruct the sequence of DCE magnetic resonance data into a series of DCE magnetic resonance images using the DCE magnetic resonance data and the contrast agent calibration.

This embodiment may be beneficial because the combined checking of the predicted DCE image quality and the estimated calibration error may help to ensure that the series of DCE magnetic resonance images have a higher image quality and/or have a higher predicted accuracy in the contrast agent measurements or quantities derived from the contrast agent measurements.

In another embodiment, execution of the machine-executable instructions further cause the processor to store the scan parameters in a log file in the memory.

Execution of the machine-executable instructions further cause the processor to repeatedly read the log file to obtain a set of current scan parameters. Execution of the machine-executable instructions further cause the processor to compare the current scan parameters to a set of predetermined scan parameters to determine if the current scan parameters are outside of a predetermined operating range. Execution of the machine-executable instructions further cause the processor to display an operating parameter warning on the user interface if the current scan parameters are outside of the predetermined operating range.

This embodiment may be beneficial because it may provide for an automatic means of checking if the scan parameters are appropriate or within predetermined guidelines for acquiring the DCE magnetic resonance images or the calibration magnetic resonance data. Often times magnetic resonance imaging parameters are interrelated. It may be difficult or impossible for a technician operating a magnetic resonance imaging system to choose the proper operating parameters. By reading the scan parameters from the log file the machine-executable instructions can effectively monitor the scan parameters and compare them to the predetermined scan parameters automatically.

In another embodiment, the predetermined scan parameters are determined from any one of the following: published standards, physician recommendations or orders, patient profiles, a patient database, and combinations thereof. This embodiment may be beneficial because it may provide multiple places to which the scan parameters can be compared.

This for example may be beneficial for providing for quality control using the particular patient profile or patient database to enable the DCE magnetic resonance images to be better compared to previous or follow up examinations.

In another embodiment, the repeated reading of the log file and the comparison of the current scan parameters is executed by the processor as a background process. This may have the advantage that it functions automatically and transparently and does not need to be monitored by an operator of the magnetic resonance imaging system.

In another embodiment, execution of the machine-executable instructions further cause the processor to display a set of suggested scan parameter changes on the user interface in response to any one of the following: the display of the operator parameter warning, the acquisition warning message, the calibration warning message, and combinations thereof. This embodiment may be beneficial because it may help an operator of the magnetic resonance imaging system to better comply with standard operating conditions for DCE scans or ensure that currently acquired DCE images and derived data may be better compared to previously acquired DCE magnetic resonance images and/or derived data.

In another embodiment, the execution of the machine-executable instructions further cause the processor to determine the set of suggested scan parameter changes at least partially using any one of the following: a lookup table, a prior scan database, a model of inter-relationships between scan parameters, and combinations thereof. This embodiment may be beneficial because they may all provide means of efficiently providing suggested parameters to an operator of the magnetic resonance imaging system.

In another embodiment, the calibration warning comprises any one of the following: a warning that the estimated calibration error is outside of the predetermined calibration range, a suggested corrective action, and combinations thereof. This embodiment may be beneficial because it may provide a means for an operator of the magnetic resonance imaging system to correct the acquisition of the magnetic resonance DCE images before the procedure has progressed very far.

In another embodiment, the calibration accuracy model is configured for estimating the estimated calibration error using any one of the following: a histogram base noise estimation model, a wavelet transform based noise estimation model, or a noise estimation model that estimates the noise using a data set that is constructed from a subtraction of different combinations of the set of variable flip angle images. In each of these examples, the signal-to-noise in the T1 mapping and/or the estimated error in the contrast agent calibration is made by using the set of variable flip angles to make and estimate of the signal-to-noise. This estimate of the noise in the images is then used to calculate the estimated calibration error.

In another embodiment, execution of the machine-executable instructions further cause the processor to control the magnetic resonance imaging system using the pulse sequence commands to acquire B1 mapping magnetic resonance data. For example any of the common methods of making a B1 magnetic resonance map may be used. The knowledge of the B1 magnetic resonance map may be beneficial in determining a more accurate T1 mapping or contrast agent calibration. Execution of the machine-executable instructions further cause the processor to calculate a B1 map using a B1 mapping magnetic resonance data. The contrast agent calibration is further calculated at least partially using the B1 map.

In another aspect, the invention provides for a computer program product comprising machine-executable instructions for execution by a processor controlling the magnetic resonance imaging system. The magnetic resonance imaging system comprises a user interface. Execution of the machine-executable instructions causes the processor to control the magnetic resonance imaging system using pulse sequence commands to acquire calibration magnetic resonance data two or more times for varying flip angles. The pulse sequence commands are configured for controlling the magnetic resonance imaging system according to a DCE magnetic resonance imaging protocol. Execution of the machine-executable instructions further cause the processor to reconstruct each acquisition of the calibration magnetic resonance data into a calibration image to calculate a set of variable flip angle images.

The set of variable flip angle images is made up on the individual calibration images. Execution of the machine-executable instructions further cause the processor to calculate a T1 mapping using the set of variable flip angle images. Execution of the machine-executable instructions further cause the processor to calculate a contrast agent calibration for a predetermined magnetic resonance imaging contrast agent using at least partially the T1 mapping. Execution of the machine-executable instructions further cause the processor to calculate an estimated calibration error that is descriptive of an estimated error in the contrast agent calibration and/or the T1 mapping using a calibration accuracy model. The calibration accuracy model is configured for calculating the estimated calibration error using the set of variable flip angle images. Execution of the machine-executable instructions further cause the processor to display a calibration warning message on the user interface if the estimated calibration error is outside of a predetermined calibration error range.

The advantages of this system have been previously discussed.

In another aspect, the invention provides for a method of operating a magnetic resonance imaging system. The magnetic resonance imaging system comprises a user interface. The method comprises placing the subject in the magnetic resonance imaging system. The method further comprises controlling the magnetic resonance imaging system using pulse sequence commands to acquire calibration magnetic resonance data two or more times for varying flip angles. The pulse sequence commands are configured for controlling the magnetic resonance imaging system according to a DCE magnetic resonance imaging protocol. The method further comprises reconstructing each acquisition of the calibration magnetic resonance data into a calibration image to create a set of variable flip angle images. The method further comprises calculating a T1 mapping using the set of variable flip angle images.

The method further comprises calculating a contrast agent calibration for a predetermined magnetic resonance imaging contrast agent using at least partially the T1 mapping. The method further comprises calculating an estimated calibration error that is descriptive of an estimated error in the contrast agent and/or the T1 mapping using a calibration accuracy model. The calibration accuracy model is configured for calculating the estimated calibration error using the set of variable flip angle images. The method further comprises displaying a calibration warning message on the user interface if the estimated calibration error is outside of a predetermined calibration error range. The advantages of this system have been previously discussed.

In another embodiment, the method further comprises receiving a set of scan parameters for controlling the magnetic resonance imaging during execution of the pulse sequence commands. The method further comprises calculating a predetermined DCE image quality using the set of scan parameters, the estimated calibration error and using a steady-state signal equation for creating echo-based magnetic resonance imaging. The method further comprises displaying an acquisition warning message on the user interface if the predicted DCE image quality is outside of a predetermined image quality range. The advantages of these additional steps has been previously discussed.

In an example, the method further comprises injecting the subject with the predetermined magnetic resonance imaging contrast agent. The method further comprises controlling the magnetic resonance imaging system with the pulse sequence commands to acquire a sequence of DCE magnetic resonance data according to the DCE magnetic resonance imaging protocol. For example the images of the DCE magnetic resonance data may be acquired at specific time intervals. The method further comprises reconstructing the sequence of DCE magnetic resonance data into a series of DCE magnetic resonance images using the DCE magnetic resonance data and the contrast agent calibration. There may be further post-processing steps where the series of DCE magnetic resonance images are used to calculate derived quantities such as the extra vascular extra cellular space or tissue parameters such as the transfer constant.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage may be any volatile or non-volatile computer-readable storage medium.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the C programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, bluetooth connection, wireless local area network connection, TCP/IP connection, ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) display, Electroluminescent display (ELD), Plasma display panel (PDP), Liquid crystal display (LCD), Organic light-emitting diode display (OLED), a projector, and Head-mounted display.

Magnetic Resonance (MR) data is defined herein as being the recorded measurements of radio frequency signals emitted by atomic spins using the antenna of a magnetic resonance apparatus during a magnetic resonance imaging scan. Magnetic resonance data is an example of medical imaging data. A Magnetic Resonance (MR) image is defined herein as being the reconstructed two or three dimensional visualization of anatomic data contained within the magnetic resonance imaging data.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
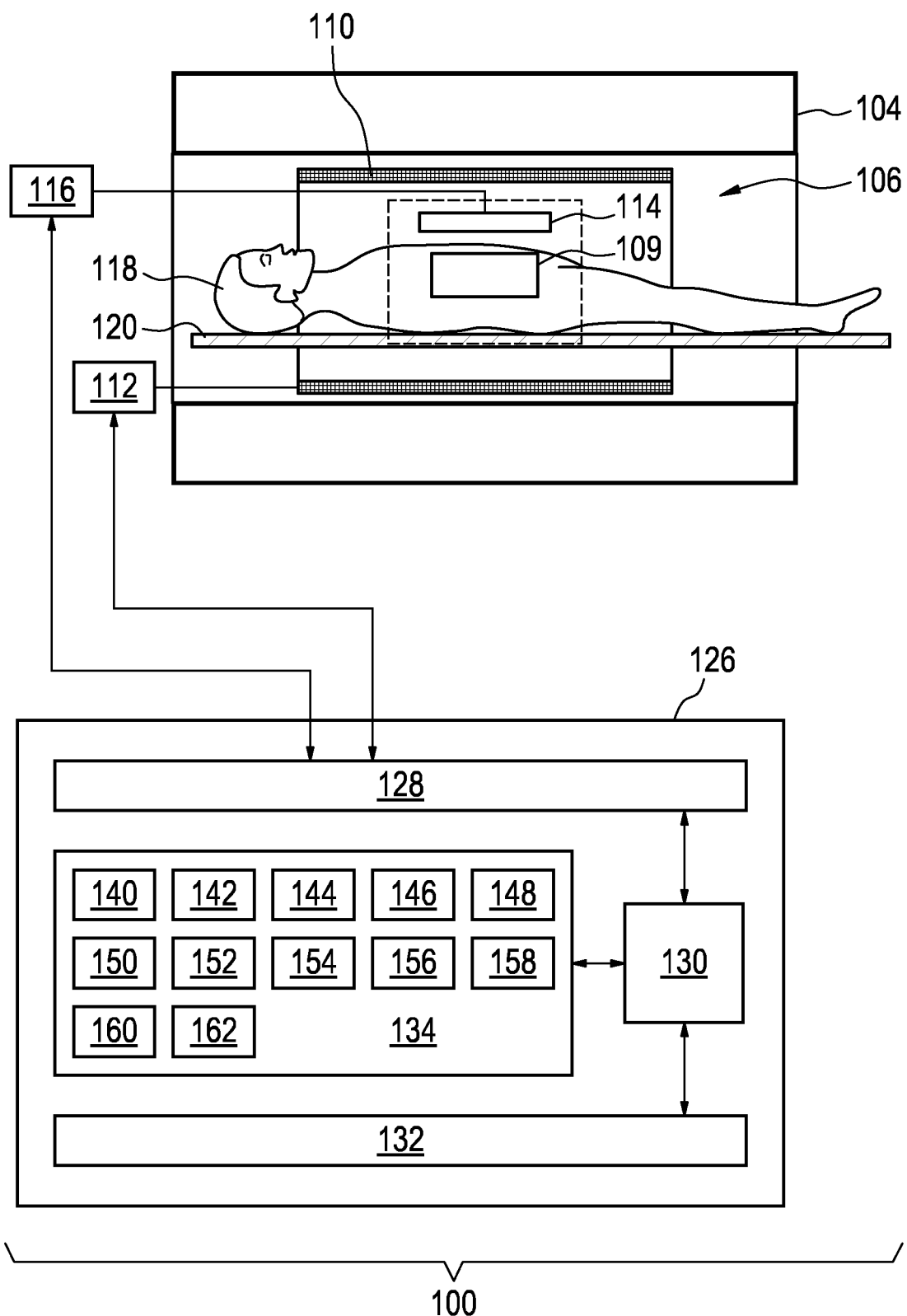
FIG. 1 illustrates an example of a magnetic resonance imaging system.

FIG. 1 shows an example of a magnetic resonance imaging system 100 with a magnet 104. The magnet 104 is a superconducting cylindrical type magnet with a bore 106 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 106 of the cylindrical magnet 104 there is an imaging zone 108 where the magnetic field is strong and uniform enough to perform magnetic resonance imaging. A region of interest 109 is shown within the imaging zone 108. A subject 118 is shown as being supported by a subject support 120 such that at least a portion of the subject 118 is within the imaging zone 108 and the region of interest 109.

Within the bore 106 of the magnet there is also a set of magnetic field gradient coils 110 which is used for acquisition of magnetic resonance data to spatially encode magnetic spins within the imaging zone 108 of the magnet 104. The magnetic field gradient coils 110 connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

Adjacent to the imaging zone 108 is a radio-frequency coil 114 for manipulating the orientations of magnetic spins within the imaging zone 108 and for receiving radio transmissions from spins also within the imaging zone 108. The radio frequency antenna may contain multiple coil elements. The radio frequency antenna may also be referred to as a channel or antenna. The radio-frequency coil 114 is connected to a radio frequency transceiver 116. The radio-frequency coil 114 and radio frequency transceiver 116 may be replaced by separate transmit and receive coils and a separate transmitter and receiver. It is understood that the radio-frequency coil 114 and the radio frequency transceiver 116 are representative. The radio-frequency coil 114 is intended to also represent a dedicated transmit antenna and a dedicated receive antenna. Likewise the transceiver 116 may also represent a separate transmitter and receivers. The radio-frequency coil 114 may also have multiple receive/transmit elements and the radio frequency transceiver 116 may have multiple receive/transmit channels. For example if a parallel imaging technique such as SENSE is performed, the radio-frequency could 114 will have multiple coil elements.

The transceiver 116 and the gradient controller 112 are shown as being connected to a hardware interface 128 of a computer system 126. The computer system further comprises a processor 130 that is in communication with the hardware system 128, a memory 134, and a display 132. The memory 134 may be any combination of memory which is accessible to the processor 130. This may include such things as main memory, cached memory, and also non-volatile memory such as flash RAM, hard drives, or other storage devices. In some examples the memory 130 may be considered to be a non-transitory computer-readable medium.

The computer memory is shown as containing a set of machine-executable instructions 140 which enable the processor 130 to control the operation and function of the magnetic resonance imaging system 100. The computer memory 134 is further shown as containing pulse sequence commands 142 which enable the processor 130 to control the magnetic resonance imaging system 100 to acquire magnetic resonance data according to a DCE magnetic resonance imaging protocol. The computer memory 134 is further shown as containing calibration magnetic resonance data 144 that was acquired by controlling the magnetic resonance imaging system with a portion of the pulse sequence commands 142. The calibration magnetic resonance data 144 is acquired multiple times and for various flip angles.

The computer memory 134 is shown as containing one calibration image 146 that was reconstructed from one acquisition of the calibration magnetic resonance data 144 for a particular flip angle. The computer memory 134 is further shown as containing a set of variable flip angle images 148 that is made up of a set of calibration images 146 that were acquired for different flip angles. The computer memory 134 is further shown as containing a T1 mapping 150 that was calculated from the set of variable flip angle images. The computer memory 134 is further shown as containing a contrast agent calibration 152 for a predetermined magnetic resonance imaging contrast agent using the T1 mapping 150.

The computer memory 134 is further shown as containing an estimated calibration error 154 that was calculated by comparing the individual images of the set of variable flip angle images 148 with each other. The estimated calibration error may for instance be an estimate of the signal-to-noise in the T1 mapping or the contrast agent calibration or may be a quantity for example derived therefrom. The computer memory 134 is further shown as containing a set of scan parameters 156 that may be used to customize the acquisition of the magnetic resonance data using the DCE magnetic resonance imaging protocol as defined by the pulse sequence commands 142.

The computer memory 134 is further shown as containing a predicted DCE image quality 158 that was calculated using the set of scan parameters 156, the estimated calibration error 154, and a model which may for example be a steady-state signal equation for magnetic resonance imaging that is used to model gradient echo-based magnetic resonance signals. The computer memory 134 is further shown as containing a log file 160 that contains the current state of an operation of the magnetic resonance imaging system. For example when particular scan parameters 156 are being used for the acquisition of magnetic resonance data or planned magnetic resonance data they are stored in the log file 160.

The computer memory is further shown as containing a set of predetermined scan parameters 162 to which the set of scan parameters 156 stored in the log file 160 can be compared against.

Figure 2:
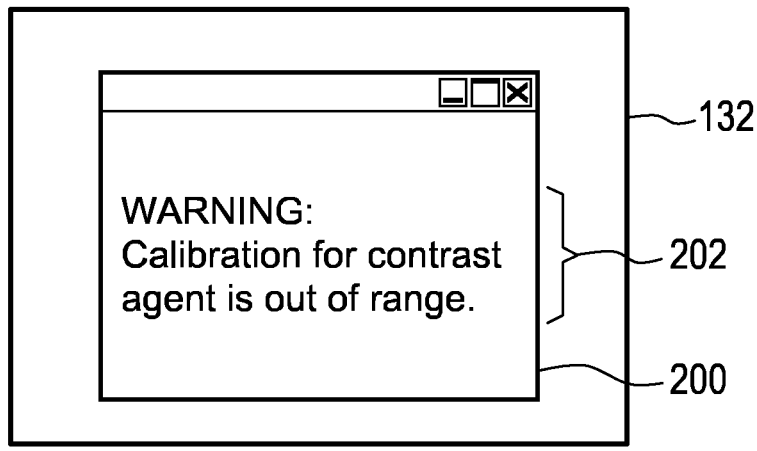
FIG. 2 illustrates an example of a user interface.

FIG. 2 shows an example of a display 132 with a graphical user interface 200. When the estimated calibration error 154 is above a predetermined amount the graphical user interface 200 may display a calibration warning message 202.

Figure 3:
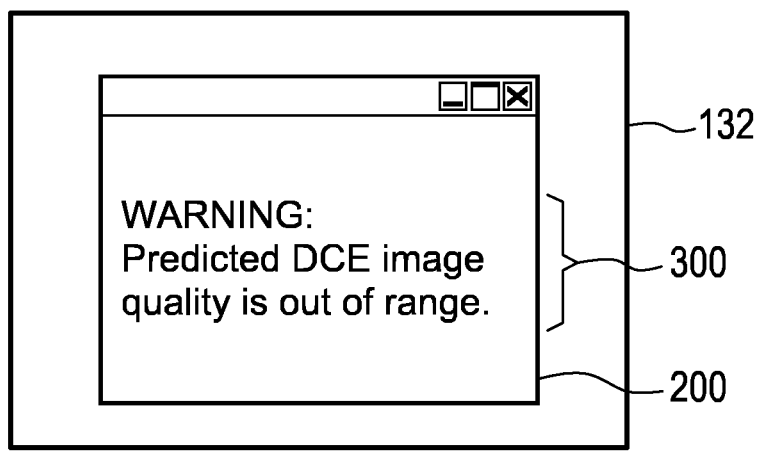
FIG. 3 illustrates a further example of a user interface.

FIG. 3 shows the display 132 and graphical user interface 200 as shown in FIG. 2. In this case the graphical user interface 200 displays an acquisition warning message 300 in response to the predicted DCE image quality 158 being outside of a predetermined image quality range.

Figure 4:
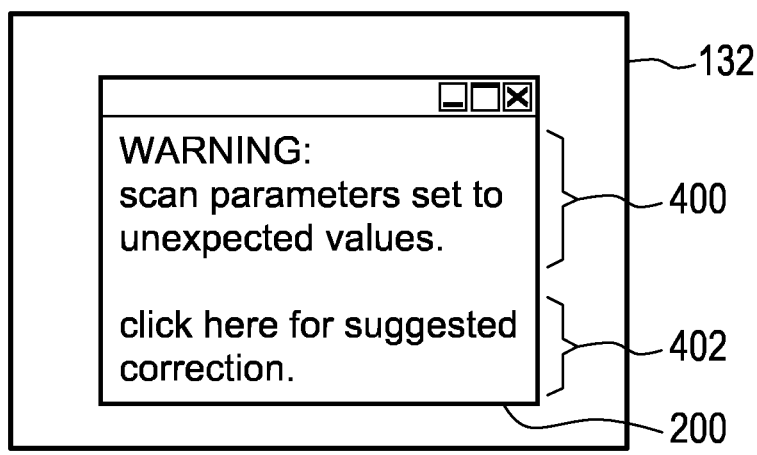
FIG. 4 illustrates a further example of a user interface.

FIG. 4 shows a further view of the display in graphical user interface 200. In this example the graphical user interface 200 displays an operation parameter warning message 400 that is displayed in response to the current scan parameters in the log file 160 being outside of a predetermined operating range. The graphical user interface 200 may also display a set of suggested corrected actions 402 or a set of suggested scan parameters to correct the error that caused the operating parameter warning message 400.

Figure 5:
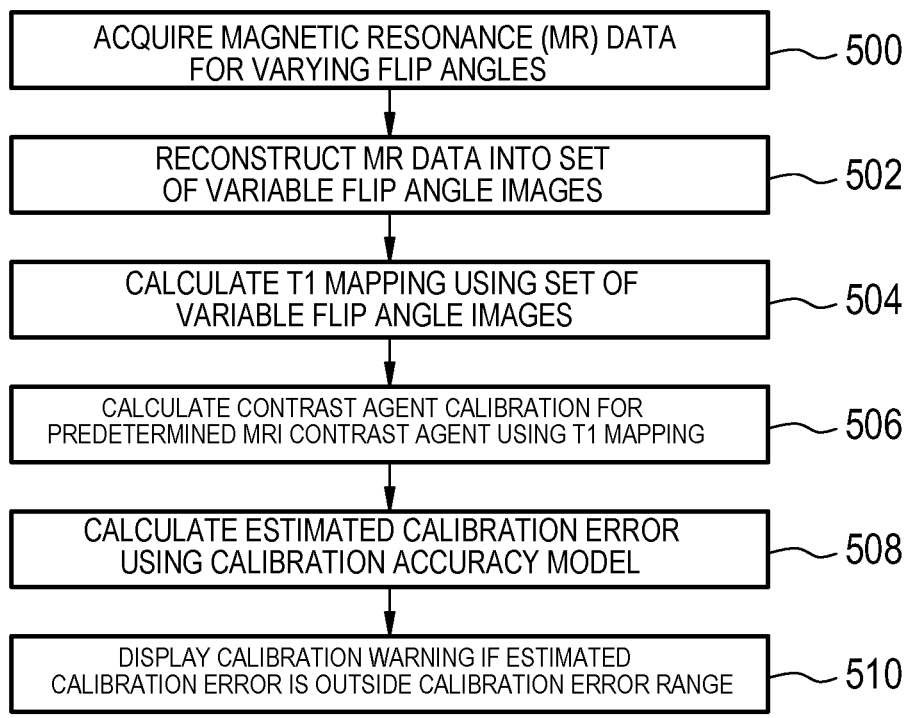
FIG. 5 shows a flow chart which illustrates a method of using the magnetic resonance imaging system of FIG. 1.

FIG. 5 shows a flowchart which illustrates a method of operating the magnetic resonance imaging system 100 of FIG. 1. First in step 500 the magnetic resonance imaging system 100 is controlled using the pulse sequence commands 142 to acquire the calibration magnetic resonance data 144. The calibration magnetic resonance data 144 is acquired multiple times for varying flip angles. Next in step 502 each acquisition of the calibration magnetic resonance data 144 is reconstructed into a calibration image 146. This is done to create a set of variable flip angle images 148. Next in step 504 a T1 mapping 150 is calculated using the set of variable flip angle images 148.

Then in step 506 a contrast agent calibration 152 is calculated for a predetermined magnetic resonance imaging contrast agent using at least partially the T1 mapping 150. Next in step 508 an estimated calibration error 154 is calculated that is descriptive of an estimated error in the contrast agent calibration 152 and/or the T1 mapping 150 using a calibration accuracy model. The calibration accuracy model is configured for calculating the estimated calibration error using the set of variable flip angle images 148. Finally in step 510 a calibration warning message 202 is displayed on the user interface 200 if the estimated calibration error is outside of a predetermined calibration error range.

Figure 6:
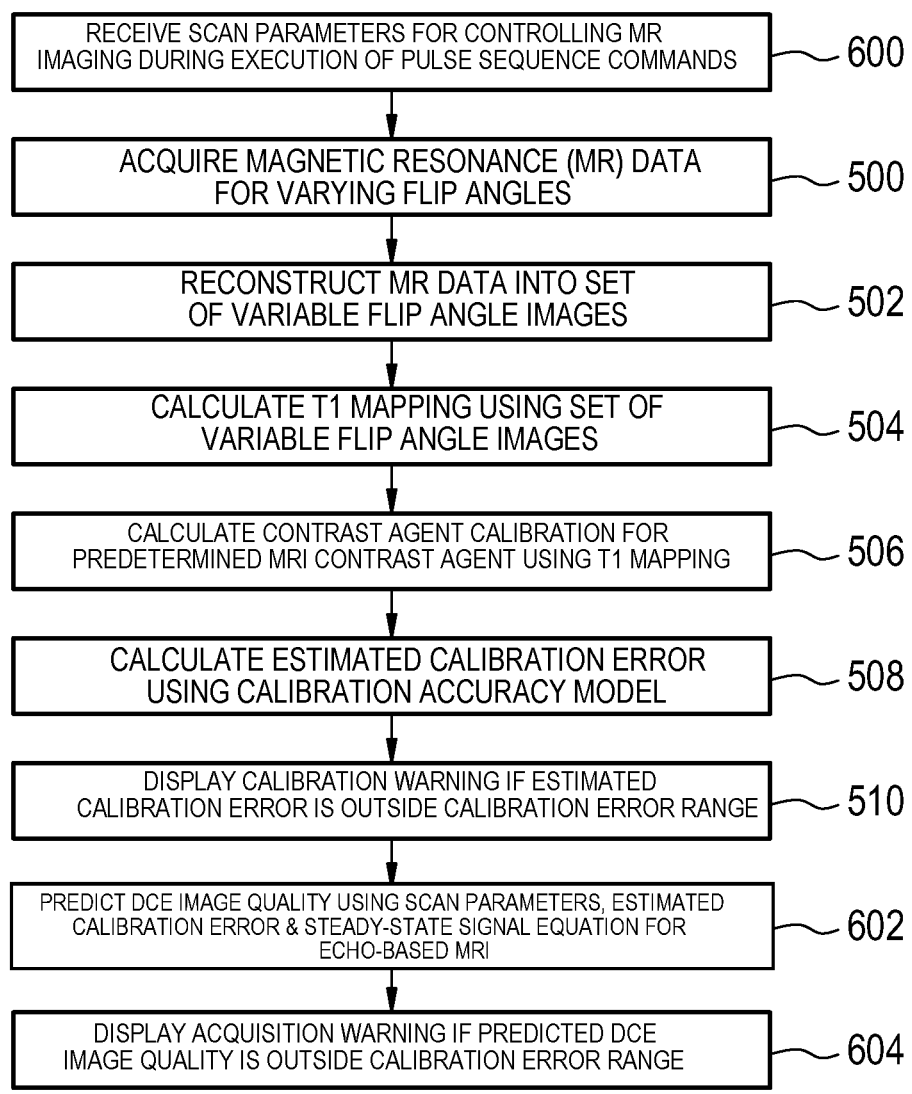
FIG. 6 shows a flow chart which illustrates a further method of using the magnetic resonance imaging system of FIG. 1.

FIG. 6 shows a flowchart which illustrates a further method of operating the magnetic resonance imaging system 100 of FIG. 1. The method of FIG. 6 is similar to FIG. 5 with several additional steps. The method in FIG. 6 starts with step 600. In step 600 a set of scan parameters 156 is received for controlling magnetic resonance imaging during execution of the pulse sequence commands 142. The method then proceeds to step 500 as is illustrated in FIG. 5. After step 510 is performed step 602 is performed. In step 602 a predicted DCE image quality 158 is calculated using the set of scan parameters 156, the estimated calibration error 154 and a model which is used to model the steady-state signal equation for creating echo-based magnetic resonance imaging. Finally in step 604 an acquisition warning message 300 is displayed on the user interface 200 if the predicted DCE image quality 158 is outside of a predetermined image quality range.

Figure 7:
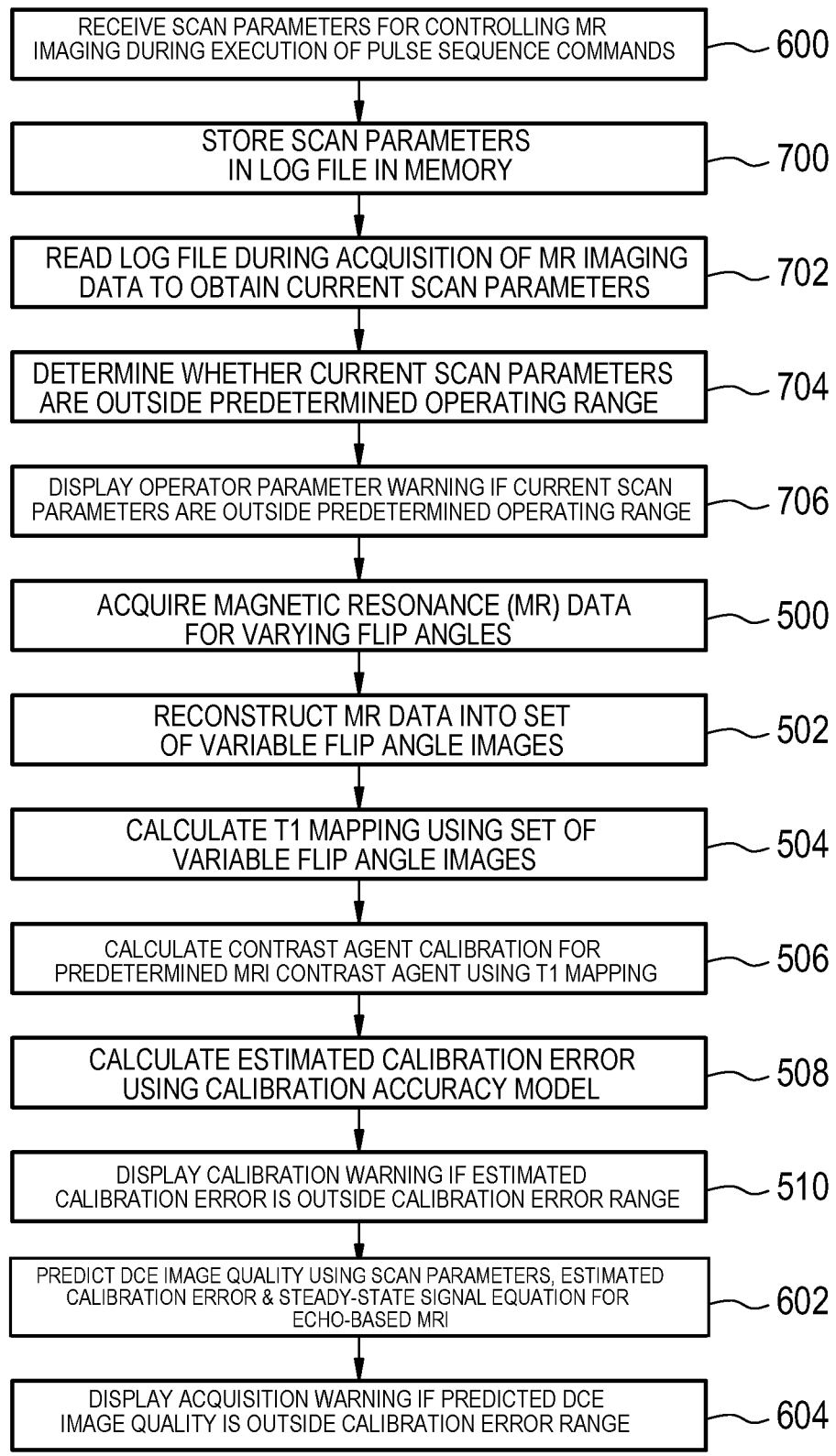
FIG. 7 shows a flow chart which illustrates a further method of using the magnetic resonance imaging system of FIG. 1.

FIG. 7 shows a flowchart which illustrates a further method of operating the magnetic resonance imaging system 100 of FIG. 1. The method illustrated in FIG. 7 is similar to that illustrated in FIG. 6. The method in FIG. 7 begins with step 600 as described in FIG. 6 again. The method then proceeds to step 700. In step 700 the scan parameters are stored in a log file in the computer memory 134. Next in step 702 the log file is read repeatedly during operation and acquisition of the magnetic resonance imaging data to obtain a set of current scan parameters. Step 702 may be repeated multiple times. After step 702 is performed step 704 is performed and the current scan parameters as read from the log file are compared to the set of predetermined scan parameters 162 to determine if the current scan parameters are outside of a predetermined operating range. Next in step 706 an operator parameter warning 400 is displayed on the user interface 200 if the current scan parameters are outside of the predetermined operating range. The method then proceeds to step 500 as is illustrated in FIG. 6. Steps 500, 502, 504, 506, 508, 510, 602 and 604 are then performed as is illustrated in FIG. 6.

Examples may provide for software or machine executable instructions for real-time active quality control and workflow support during the definition, acquisition and post-processing of standardized, quantitative DCE-MRI measurements. It may comprise of one or more of three levels of quality control: 1) It ensures compliance with pre-defined standardized guidelines as well as comparability of follow-up examinations. 2) It facilitates real-time automatic analysis and prediction of image quality. 3) It predicts the accuracy of the quantitative post-processing using forward modeling. Significant deviations during the procedure or in the measured or predicted quality are reported to the operator just in time including proposals for corrective action. These features facilitate a standardized, robust and reproducible acquisition of DCE-MRI data and subsequent production of derived parameter maps with controlled quantitative accuracy.

Quantitative magnetic resonance imaging (MRI) is widely regarded as a paradigm shift towards personalized precision medicine because it facilitates evaluation of pathology using absolute tissue properties rather than visual interpretation of qualitative contrast-weighted images. An important technique is dynamic contrast-enhanced MRI (DCE-MRI), which can be used to quantify tissue parameters such as the transfer constant $K^{trans}$ or the fractional volume of the extravascular extracellular space, $v_e$. These parameters have been shown to be useful as biomarkers of tumor metabolism in a large number of studies. A major challenge of quantitative DCE-MRI is the high variability of the results due to lack of standardization and quality control in both data acquisition and post-processing. Results of different studies are, thus, difficult to compare. As a consequence, quantitative DCE-MRI is currently mainly performed in research hospitals, and adoption in standard clinical settings is still limited.

To overcome these challenges, organizations like the Quantitative Imaging Biomarkers Alliance (QIBA) seek to reduce the variability of quantitative DCE-MRI by providing profiles that feature detailed recommendations of the different procedures.

Even with standardized protocol recommendations or guidelines, the overall procedure to obtain quantitative parameter maps remains complex and comprises multiple critical and error-prone steps during acquisition and post-processing. Application of DCE-MRI in a clinical study or in the clinical routine therefore faces several challenges:

Most standardization guidelines include a detailed list of allowed ranges of the MR acquisition parameters. In the clinical routine, it is challenging to ensure that all measurements are performed according to the guideline. For example, the specific patient anatomy may require adjustments of the MR sequence parameters. In this case, the user faces the difficult task of adjusting the parameters without violating the guidelines. Similarly, in case of follow-up examinations, ideally all acquisition parameters should be identical for all measurements to ensure comparability. The precise values of these parameters in previous examinations are, however, usually not directly available to the user.

In the clinical setting, the accuracy and precision of the measurement can be affected by a variety of events such as hardware defects or coil misplacement. In these cases, the quality of the acquired images may be impaired even if the acquisition is performed according to the standardization guidelines. Such cases currently require careful visual inspection of the images.

The impact of a specific parameter setting or image quality on the tissue parameter quantification is not known to the user at the time of measurement. Problems due to suboptimal parameter settings will typically only be revealed during post-processing, i.e. long after the measurement. This typically leads to patient re-scheduling to obtain adequate quantitative results.

Examples may therefore realizes an active quality control and workflow support system that may comprise of one or more of the following three levels:

In a first level, the state of the MR measurement protocol is continuously monitored. Any significant deviation from the pre-defined protocol according to standardized guidelines is detected and a warning is issued to the user. In case of a follow-up examination for therapy control, comparability of the results is ensured by issuing a warning if deviations to the setup of previous examinations are detected.

In a second level, sufficient image quality is ensured by analyzing the images from already completed scans in real time. In case of low image quality, a warning is issued to the user, including a suggestion to modify the acquisition. As a quantitative DCE-MRI exam consists of 2 or more scans, the information obtained in the first scans can be favourably used to find issues before starting subsequent scans, i.e. while modifications are still possible. In particular, necessary modifications can be done prior to contrast injection, after which scan operation is time critical and cannot be repeated.

In the third level, the expected accuracy (DCE image quality) of the quantitative post-processing is continuously predicted during the examination using forward modeling. In case of low expected accuracy, warnings as well as suggestions for protocol modification are displayed.

The real-time active quality control is based on two software (SW) components, and is further described below.

Modification of the SW operating the MR system ("MR console") and/or performing post-processing steps ("MR workstation") that automatically supplies all required information about the current, planned and finished scans to the quality control SW.

A quality and workflow control SW (running on the MR console or the MR workstation or on a separate monitoring system, e.g. a tablet computer) that realizes the active quality control, including real-time evaluation of acquired data and feedback to the user.

As a first step, additional SW on the MR console and/or the MR workstation supplies information about the current measurement protocol such as MR sequence parameters, scan status, processing parameters, applied data models and patient information to the quality and workflow control SW. This information can for example be included in the standard status logging mechanism created on the MR console/workstation and the corresponding log-file can be transferred and evaluated by the quality and workflow control SW. Moreover, reconstructed image data obtained from completed scans are transferred to the quality control SW (e.g. by temporal disk storage) to allow for real-time analysis of image quality metrics such as signal-to-noise ratio (SNR).

Finally, the quality and workflow control SW may use a local patient specific database to store information about the measurement protocol to allow to compare the conditions of follow-up examinations on the same patient.

In a second step, the quality and workflow control SW is implemented as an additional program intended to run in parallel to the MR acquisition or image post-processing. This can be either implemented on the MR console or on the MR workstation or on a separate monitoring system, e.g. a tablet computer. A schematic overview of a possible implementation for the intended functionality is shown in FIG. 8.

Figure 8:
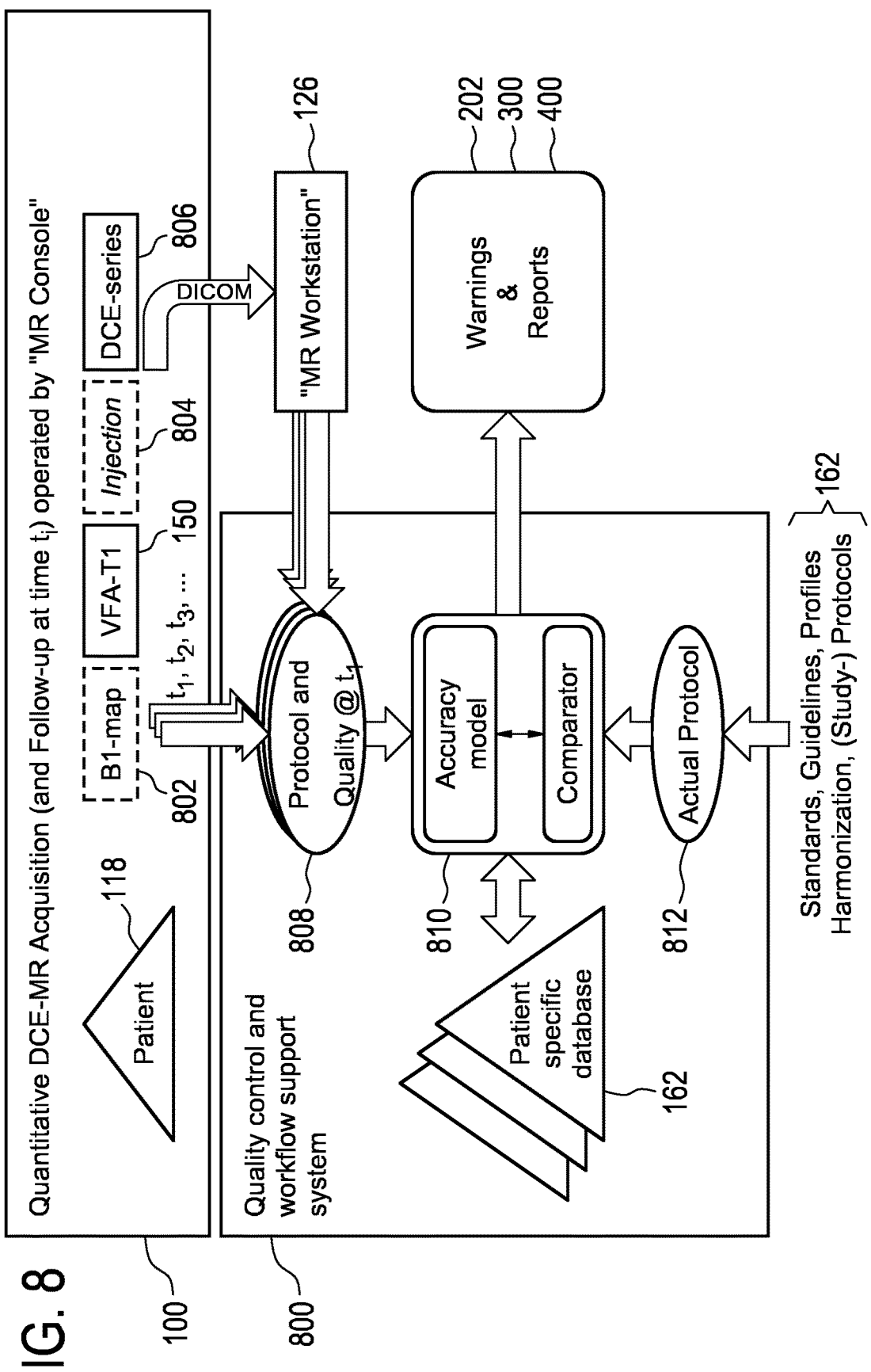
FIG. 8 contains a diagram which represents a magnetic resonance imaging system for at least a portion of its functionality.

FIG. 8 represents the magnetic resonance imaging system 100 from a functional standpoint. Box 100 represents a number of measurements acquired by the magnetic resonance imaging system 100. Box 800 represents a quality control and workflow system 800 that may for example be implemented by the machine-executable instructions. Box 126 represents workflow performed by the computer system 126. The output of the quality control workflow system 800 may for example be a number of warnings and reports which may be equivalent to the calibration warning message 202, the acquisition warning message 300, and the operator parameter warning message 400.

The magnetic resonance imaging system may acquire a variety of data. This may include B1 maps 802, variable flip angle images which are constructed into a T1 mapping 150 may also represent the injection of contrast agent 804 into the patient or subject 118 and the acquisition of a series of DCE magnetic resonance images 806. It however should be noted that the calculation and display of the various warning messages 202, 300, 400 is performed before any injection is performed. The quality control and workflow support system 800 may have a number of components. It may have patient-specific databases 162, standards and guidelines and harmonization and protocols 162 may all be combined into a set of predetermined scan parameters.

For example the actual protocol or current scan parameters 812 may be input into an accuracy model 810 and comparator 810 which uses various protocols and image quality 808 has input. The accuracy model 810 and comparator may correspond to the calibration accuracy model and the steady-state signal equation for creating echo-based magnetic resonance imaging, and the code which does the comparison between the current scan parameters and the predetermined scan parameters. In some examples the quality control and workflow support system runs as a background process so that the operators are not aware of its presence unless a warning or report 202, 300, 404 needs to be issued.

In a typical quantitative DCE-MRI examination is schematically depicted at the top of FIG. 8: it consists of a B1-mapping scan, a series of variable flip-angle (VFA) scans to be used later for T1-mapping (needed for the calibration of contrast agent concentrations), and the contrast-agent injection during the acquisition of a dynamic series (DCE scan).

The actual protocol used by the SW is initialized using pre-defined external standards, recommendations or guidelines or by a study-specific protocol that define quality targets such as allowed sequence parameter ranges and desired image quality metrics, e.g. SNR, bounds for tolerated errors in T1/B1-mapping or bounds for expected variances in model based quantitative post-processing.

The SW receives a continuous data stream from the MR console or workstation (e.g. by continuously extracting data from log-files) to construct an internal real-time representation of the current measurement protocol and its quality.

This information is supplied to different accuracy models, whose results are compared to the actual profile of the SW. In case of guideline compliance, the accuracy model simply yields the current set of sequence parameters. Alternatively, comparability of the results is ensured by issuing a warning if deviations to the setup of previous examinations are detected. Different user profiles can be employed to display warnings depending on their severity and the purpose of the measurement.

A central guideline for defining suitable and timely warnings is to reduce user interaction to a minimum in order not to distract from the standardized workflow. Importantly, the quality and workflow support SW should remain invisible (no user interaction) while scanning and post-processing conditions are still within expectations, or when there is no possible corrective action available at present. Quality issues without real-time mitigation shall be reported in subsequent performance analyses (e.g. for hospital management). Extensive logging of the sequence of user actions, image quality and post-processing analysis results as well as actually issued warnings shall be performed in the background in order to allow performance analyses on multiple levels for the benefit of different stakeholders (e.g. technologist, radiologist, hospital manager).

As an example for real-time image quality analysis, the additional SW on the MR console automatically supplies reconstructed images to the active quality control SW as soon as the execution of a scan is completed. In case of VFA scans, which typically involve signal averaging (number-of-signal-averages (NSA)≥2), the individual images are reconstructed and sent to the quality control SW before averaging. An accuracy model then realizes a subtraction of these individual images to obtain a dataset that can be used to determine the noise level in the averaged image. Alternatively, automatic histogram-based or wavelet-transform based methods for noise estimation can be applied. At the same time, the approximate signal level for the tissue of interest is determined using both the native T1 map as well as a look-up table of typical T1 values for the examined organ of interest. Combining both results yields the SNR in the organ of interest. The expected SNR of the DCE scan is then predicted using this VFA-SNR as well as the selected acquisition parameters (NSA, flip angle, repetition time, etc.) and the steady-state signal equation for gradient echo based sequences. Both calculated SNR values are compared to the pre-defined profile to detect unusually low image quality. In addition to this SNR-based assessment, other accuracy models based on metrics that correlate to the overall artifact level can be realized to evaluate image quality.

Finally, to ensure quality control of the post-processing, an accuracy model predicts the accuracy and precision of quantitative parameters derived from the various images. The accuracy and precision of the T1 mapping is determined using a Monte Carlo method that employs the previously determined SNR of the different VFA scans. A closed-form expression may be used for time-efficient calculation of the concentration measurement accuracy and precision. This way, inadequate sequence parameters settings or image artefacts can be corrected before the non-repeatable contrast agent injection. After each modification of the protocol by the user, the SW rebuilds its internal representation of the measurement protocol and again executes all accuracy models. If a deviation is detected (e.g., if a parameter value is outside its allowed range, or the detected image SNR is lower than desired), a visual warning is displayed to the user, and a suggestion for correction is shown to the operator.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 magnetic resonance imaging system
104 magnet
106 bore of magnet
108 imaging zone
109 region of interest
110 magnetic field gradient coils
112 magnetic field gradient coil power supply
114 radio-frequency coil
116 transceiver
118 subject
120 subject support
126 computer system
128 hardware interface
130 processor
132 display
134 computer memory
140 machine executable instructions
142 pulse sequence commands
144 calibration magnetic resonance data
146 calibration image
148 set of variable flip angle images
150 T1 mapping
152 contrast agent calibration
154 estimated calibration error
156 set of scan parameters
158 predicted DCE image quality
160 log file
162 set of predetermined scan parameters
200 graphical user interface
202 calibration warning message
300 acquisition warning message
400 operating parameter warning message
402 suggested corrected action
800 quality control and work flow system
802 B1 map
804 injection
806 DCE magnetic resonance images
808 protocol and quality @ t1
810 accuracy model and comparator
812 current scan parameters

The invention claimed is:

1. A magnetic resonance imaging system, comprising:
a memory for storing machine executable instructions and pulse sequence commands, wherein the pulse sequence commands are configured for controlling the magnetic resonance imaging system according to a Dynamic Contrast Enhanced (DCE) Magnetic Resonance Imaging protocol,
a user interface; and
a processor for controlling the magnetic resonance imaging system, wherein execution of the machine executable instructions causes the processor to:
receive a set of scan parameters for controlling the magnetic resonance imaging system during execution of the pulse sequence commands,
control the magnetic resonance imaging system using the pulse sequence commands to acquire calibration magnetic resonance data two or more times for varying flip angles,
reconstruct each acquisition of the calibration magnetic resonance data into a calibration image to create a set of variable flip angle images,
calculate a T1 mapping using the set of variable flip angle images,
calculate a contrast agent calibration for a predetermined magnetic resonance imaging contrast agent using at least partially the T1 mapping,
calculate an estimated calibration error that is descriptive of an estimated error in the contrast agent calibration and/or the T1 mapping using a calibration accuracy model, wherein the calibration accuracy model is configured for calculating the estimated calibration error using the set of variable flip angle images,
display a calibration warning message on the user interface if the estimated calibration error is outside of a predetermined calibration error range,
calculate a predicted DCE image quality using the set of scan parameters, the estimated calibration error, and a steady-state signal equation for gradient echo based magnetic resonance imaging, and
display an acquisition warning message on the user interface if the predicted DCE image quality is outside of a predetermined image quality range.

2. The magnetic resonance imaging system of claim 1, wherein execution of the machine executable instructions further causes the processor to:
control the magnetic resonance imaging system with the pulse sequence commands to acquire a sequence of DCE magnetic resonance data; and
reconstruct the sequence of DCE magnetic resonance data into a series of DCE magnetic resonance images using the DCE magnetic resonance data and the contrast agent calibration.

3. The magnetic resonance imaging system of claim 1, wherein execution of the machine executable instructions further causes the processor to:
store the scan parameters in a log file in the memory;
repeatedly read the log file to obtain a set of current scan parameters;
compare the current scan parameters to a set of predetermined scan parameters to determine if the current scan parameters are outside of a predetermined operating range; and
display an operating parameter warning of the user interface if the current scan parameters are outside of the predetermined operating range.

4. The magnetic resonance imaging system of claim 3, wherein the predetermined scan parameters are determined from any one of the following: published standards, physician recommendations or orders, patient profiles, a patient database, and combinations thereof.

5. The magnetic resonance imaging system of claim 3, wherein the repeated reading of the log file and the comparison of the current scan parameters is executed by the processor as a background process.

6. The magnetic resonance imaging system of claim 3, wherein execution of the machine executable instructions further causes the processor to display a set of suggested scan parameter changes on the user interface in response to any one of the following: the display of the operator parameter warning, the acquisition warning message, the calibration warning message, and combinations thereof.

7. The magnetic resonance imaging system of claim 6, wherein the execution of the machine executable instructions further causes the processor to determine the set of suggested scan parameter changes at least partially using any one of the following: a look up table, a prior scan database, a model of inter-relationships between scan parameters, and combinations thereof.

8. The magnetic resonance imaging system of claim 1, wherein the calibration warning comprises any one of the following:
a warning that the estimated calibration error is outside of the predetermined calibration error range, a suggested corrective action, and combinations thereof.

9. The magnetic resonance imaging system of claim 1, wherein the calibration accuracy model is configured for calculating the estimated calibration error using one of the following: a histogram based noise estimation model, a wavelet-transform based noise estimation model, or a noise estimation model that estimates the noise by using a data set that is constructed from a subtraction of different combinations of the set of variable flip angle images.

10. The magnetic resonance imaging system of claim 1, wherein execution of the machine executable instructions further causes the processor to:
control the magnetic resonance imaging system using the pulse sequence commands to acquire B1 mapping magnetic resonance data; and
calculate a B1 map using the B1 mapping magnetic resonance data, wherein the contrast agent calibration is further calculated at least partially using the B1 map.

11. A non-transitory computer readable medium having stored thereon machine executable instructions for execution by a processor controlling a magnetic resonance imaging system, wherein the magnetic resonance imaging system comprises a user interface, wherein execution of the machine executable instructions causes the processor to:
receive a set of scan parameters for controlling the magnetic resonance imaging system during execution of pulse sequence commands;
control the magnetic resonance imaging system using the pulse sequence commands to acquire calibration magnetic resonance data two or more times for varying flip angles, wherein the pulse sequence commands are configured for controlling the magnetic resonance imaging system according to a Dynamic Contrast Enhanced (DCE) Magnetic Resonance Imaging protocol;
reconstruct each acquisition of the calibration magnetic resonance data into a calibration image to create a set of variable flip angle images;

calculate a T1 mapping using the set of variable flip angle images;

calculate a contrast agent calibration for a predetermined magnetic resonance imaging contrast agent using at least partially the T1 mapping;

calculate an estimated calibration error that is descriptive of an estimated error in the contrast agent calibration and/or the T1 mapping using a calibration accuracy model, wherein the calibration accuracy model is configured for calculating the estimated calibration error using the set of variable flip angle images;

display a calibration warning message on the user interface if the estimated calibration error is outside of a predetermined calibration error range;

calculate a predicted DCE image quality using the set of scan parameters, the estimated calibration error, and a steady-state signal equation for gradient echo based magnetic resonance imaging;

display an acquisition warning message on the user interface if the predicted DCE image quality is outside of a predetermined image quality range.

12. A method of operating a magnetic resonance imaging system, wherein the magnetic resonance imaging system comprises a user interface, wherein the method comprises:

receiving a set of scan parameters for controlling the magnetic resonance imaging during execution of the pulse sequence commands;

controlling the magnetic resonance imaging system using pulse sequence commands to acquire calibration magnetic resonance data two or more times for varying flip angles, wherein the pulse sequence commands are configured for controlling the magnetic resonance imaging system according to a Dynamic Contrast Enhanced (DCE) Magnetic Resonance Imaging protocol;

reconstructing each acquisition of the calibration magnetic resonance data into a calibration image to create a set of variable flip angle images;

calculating a T1 mapping using the set of variable flip angle images;

calculating a contrast agent calibration for a predetermined magnetic resonance imaging contrast agent using at least partially the T1 mapping;

calculating an estimated calibration error that is descriptive of an estimated error in the contrast agent calibration and/or the T1 mapping using a calibration accuracy model, wherein the calibration accuracy model is configured for calculating the estimated calibration error using the set of variable flip angle images;

displaying a calibration warning message on a user interface if the estimated calibration error is outside of a predetermined calibration error range;

calculating a predicted DCE image quality using the set of scan parameters, the estimated calibration error, and a steady-state signal equation for gradient echo based magnetic resonance imaging; and displaying an acquisition warning message on the user interface if the predicted DCE image quality is outside of a predetermined image quality range.

13. The method of claim 12, wherein the method further comprises:

injecting the subject with the predetermined magnetic resonance imaging contrast agent;

controlling the magnetic resonance imaging system with the pulse sequence commands to acquire a sequence of DCE magnetic resonance data; and reconstructing the sequence of DCE magnetic resonance data into a series of DCE magnetic resonance images using the DCE magnetic resonance data and the contrast agent calibration.

14. The non-transitory computer readable medium of claim 11, wherein execution of the machine executable instructions further causes the processor to:

control the magnetic resonance imaging system with the pulse sequence commands to acquire a sequence of DCE magnetic resonance data; and reconstruct the sequence of DCE magnetic resonance data into a series of DCE magnetic resonance images using the DCE magnetic resonance data and the contrast agent calibration.

15. The non-transitory computer readable medium of claim 11, wherein execution of the machine executable instructions further causes the processor to:

store the scan parameters in a log file in the memory;

repeatedly read the log file to obtain a set of current scan parameters;

compare the current scan parameters to a set of predetermined scan parameters to determine if the current scan parameters are outside of a predetermined operating range; and display an operating parameter warning of the user interface if the current scan parameters are outside of the predetermined operating range.

16. The non-transitory computer readable medium of claim 15, wherein the predetermined scan parameters are determined from any one of the following: published standards, physician recommendations or orders, patient profiles, a patient database, and combinations thereof.

17. The non-transitory computer readable medium of claim 15, wherein the repeated reading of the log file and the comparison of the current scan parameters is executed by the processor as a background process.

18. The non-transitory computer readable medium of claim 15, wherein execution of the machine executable instructions further causes the processor to display a set of suggested scan parameter changes on the user interface in response to any one of the following: the display of the operator parameter warning, the acquisition warning message, the calibration warning message, and combinations thereof.

19. The non-transitory computer readable medium of claim 18, wherein the execution of the machine executable instructions further causes the processor to determine the set of suggested scan parameter changes at least partially using any one of the following: a look up table, a prior scan database, a model of inter-relationships between scan parameters, and combinations thereof.

20. The non-transitory computer readable medium of claim 11, wherein execution of the machine executable instructions further causes the processor to:

control the magnetic resonance imaging system using the pulse sequence commands to acquire B1 mapping magnetic resonance data; and calculate a B1 map using the B1 mapping magnetic resonance data, wherein the contrast agent calibration is further calculated at least partially using the B1 map.

* * * * *